US008633728B2

(12) United States Patent
Panozzo

(10) Patent No.: US 8,633,728 B2
(45) Date of Patent: Jan. 21, 2014

(54) SURGE TESTING METHOD AND SYSTEM FOR A BAR-WOUND STATOR

(75) Inventor: Edward Panozzo, Mokena, IL (US)

(73) Assignee: GM Global Technology Operations LLC, Detroit, MI (US)

( * ) Notice: Subject to any disclaimer, the term of this patent is extended or adjusted under 35 U.S.C. 154(b) by 130 days.

(21) Appl. No.: 13/299,416

(22) Filed: Nov. 18, 2011

(65) Prior Publication Data

US 2013/0127490 A1 May 23, 2013

(51) Int. Cl.
*G01R 31/34* (2006.01)
*G01R 31/06* (2006.01)
*G01R 31/02* (2006.01)

(52) U.S. Cl.
USPC ................ 324/765.01; 324/546; 324/537

(58) Field of Classification Search
USPC ............... 324/765.01, 750.02, 537, 500, 522, 324/527, 601, 202, 130, 74
See application file for complete search history.

(56) References Cited

U.S. PATENT DOCUMENTS

| 3,869,664 | A | | 3/1975 | Safer et al. |
| 4,922,172 | A | * | 5/1990 | Roddy et al. ................. 318/490 |
| 5,740,600 | A | * | 4/1998 | Rasberry ........................ 29/596 |
| 6,035,265 | A | * | 3/2000 | Dister et al. .................. 702/183 |
| 6,483,319 | B1 | * | 11/2002 | Kendig et al. ................ 324/551 |
| 7,034,428 | B2 | | 4/2006 | Cai et al. |
| 7,633,198 | B2 | * | 12/2009 | Kirkman et al. ............... 310/71 |

* cited by examiner

*Primary Examiner* — Hoai-An D Nguyen
(74) *Attorney, Agent, or Firm* — Quinn Law Group, PLLC

(57) ABSTRACT

A method for surge testing a bar-wound stator includes electrically connecting a conductive lead of a test system to a corresponding welded hair pin in each of the layers mid-way through the stator windings. A calibrated voltage surge is applied via the conductive leads into the windings of the stator at the welded hair pins. The method includes measuring a voltage drop between turns of the windings after applying the calibrated voltage surge, recording the measured voltage drop in memory of the test system, and executing a control event with respect to the stator when the measured voltage drop is more than a calibrated threshold voltage drop. A system for surge testing the bar-wound stator includes a test device having a capacitor for storing the calibrated surge voltage and a pin set that is electrically connected to the test device. The pin set includes the conductive wires and leads.

14 Claims, 2 Drawing Sheets

SURGE TESTING METHOD AND SYSTEM FOR A BAR-WOUND STATOR

TECHNICAL FIELD

The present disclosure relates to a method and a system for surge testing of a bar-wound stator of a poly-phase electric motor.

BACKGROUND

A stator of a poly-phase electric motor typically undergoes electrical testing during manufacturing. Surge testing is one such test. During conventional surge testing, a capacitor is rapidly discharged to inject a voltage surge into the phase leads of the stator. This rapid electrical discharge produces a sinusoidal wave for one or more phases of the electric motor. The voltage surge stresses the stator's insulation, and thus can be used to detect electrical shorts or other potential insulation issues.

In a bar-wound stator, conductive coils of wire are replaced with solid copper bars known as "hair pin" conductors. The hair pins are individually inserted into slots of a laminated stack of the stator. The hair pins are generally configured with a curved section terminating in a pair of wire ends and are formed into a shape suitable for insertion into the stator slots. An insulating material is used prior to insertion of the hair pins in the stator slots such that adjacent surfaces of the hair pins are electrically insulated with respect to each other and from the laminated stack. Portions of the wires protruding from the laminated stack after insertion of the hair pins are bent or twisted to form a complex weave pattern, thereby creating wire end pairs. Adjacent wire end pairs are typically welded together at one side of the laminated stack to form the required electrical connections/circuits between the various layers of the stator.

SUMMARY

A method is disclosed herein for surge testing of a bar-wound stator, e.g., of the type used in some high-voltage electric traction motors. As is well understood in the art, a bar-wound stator differs substantially from a conventional wire-wound stator in the use of individual conductive bars in the stator slots in lieu of pre-wound coils of wire. The slots of a bar-wound stator have a significantly higher copper fill than the slots of a typical wire-wound stator. A bar-wound design thus exhibits unique performance characteristics. However, it is recognized herein that conventional surge testing alone may be less than optimal when used with bar-wound stators due to how the inductive load of a given coil changes when the same phase changes layers within the stator. The present method may be used to help solve this potential problem.

A bar-wound stator may have multiple interconnected layers. Each stator pole may be welded into a welded joint and insulated at one or both ends or sides of the laminated stack. The phase leads extend from the opposite end or side of the stack. Conventional surge testing electrically grounds two of the phase leads and injects a surge voltage into the remaining phase lead. This process can be repeated until each of the phase leads has been surge tested. A substantial percentage of electrical failures in a given motor occur at the coil turns between phases or turns of the same phase, for instance due to insufficient or stressed insulation at these locations. The present approach may be used to augment conventional surge testing techniques by directly accessing and stressing the stator at the approximate middle point of the layers, e.g., using the presently disclosed test system.

In particular, a method is disclosed for surge testing a bar-wound stator. The stator tested according to the present method includes a plurality of welded hair pins arranged to form a plurality of stator layers. The method includes electrically connecting a conductive lead of a test system to a welded hair pin of each of the layers of the stator such that each conductive lead is electrically connected to the stator approximately mid-way through windings of the corresponding layer. The method further includes applying a calibrated voltage from a capacitor to the windings of the stator via the conductive leads, and then measuring a voltage drop between the layers at turns of the windings. The measured voltage drop is then recorded in memory of the test system. A control event may be executed with respect to the stator in response to the level of the measured voltage drop.

A test system is also disclosed for surge testing a bar-wound stator. As noted above, the stator has welded hair pins arranged in a plurality of layers. The test system includes a test device having a capacitor. The capacitor is in electrical communication with a power supply/line through a set of power conditioning components, and is configured for storing a calibrated voltage when charged via the components. The test device selectively discharges the calibrated voltage as a calibrated voltage surge or spike.

A pin set is electrically connected to the test device. The pin set includes wires and a plurality of conductive leads. Each of the conductive leads is connected at one end to a corresponding one of the wires, and at another end to the test device. The conductive leads are selectively connectable to a welded hair pin of the stator, prior to insulating the welds, at each of the layers approximately mid-way through windings of the corresponding layer.

The test device is configured to selectively discharge the capacitor to thereby apply the calibrated voltage surge into the windings of the stator via the conductive leads. The test device also calculates a voltage drop between the layers at turns of the stator windings after discharging the capacitor. The test device may record the measured voltage drop in memory, and then execute a control event with respect to the stator in response to the value of the measured voltage drop.

The above features and advantages are readily apparent from the following detailed description of the best modes for carrying out the invention when taken in connection with the accompanying drawings.

DETAILED DESCRIPTION

Figure 1:
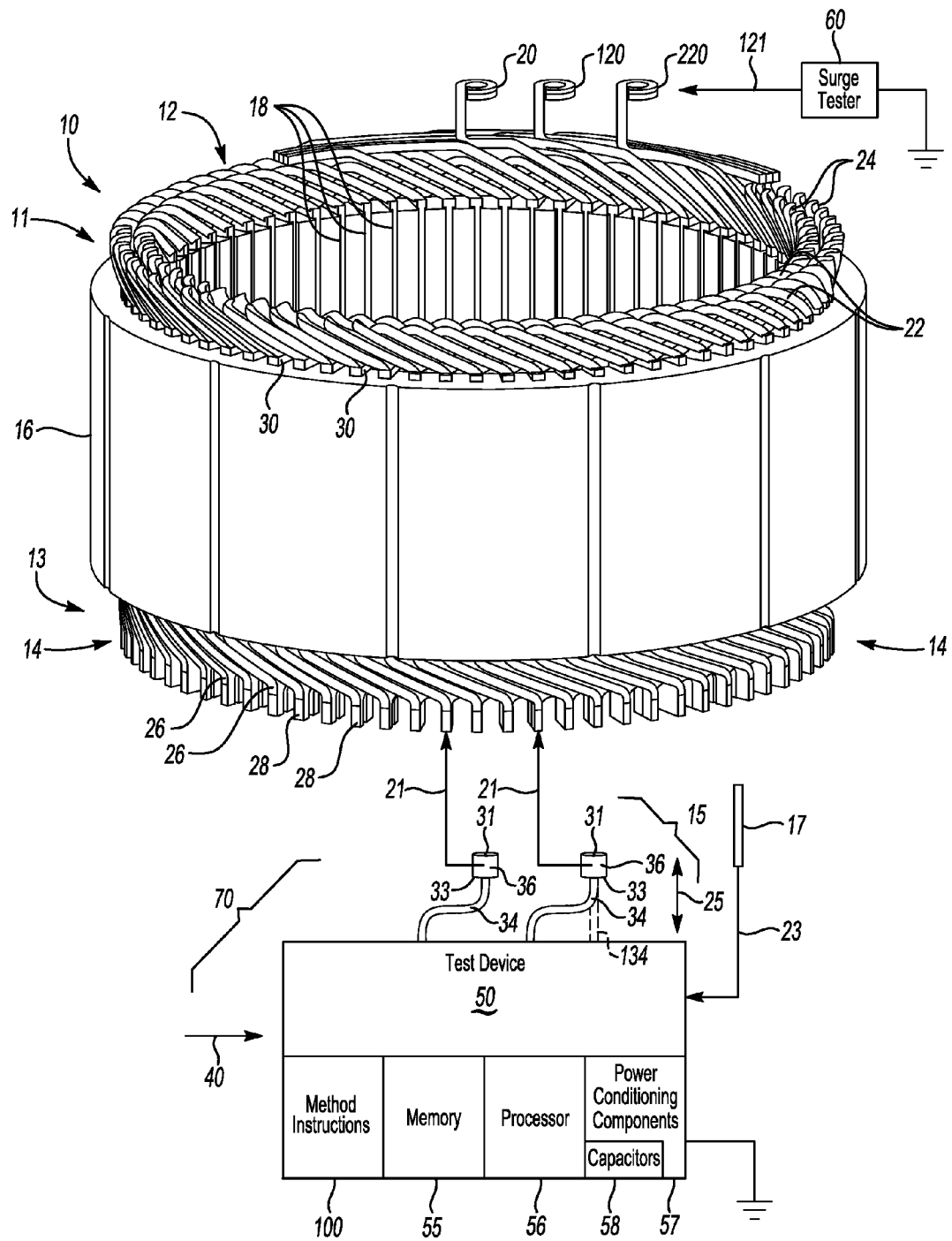
FIG. 1 is a schematic illustration of a surge testing system for an electric motor having a bar-wound stator.

Referring to the drawings, wherein like reference numbers represent like components throughout the several figures, an example bar-wound stator 10 is shown schematically in FIG. 1. The stator 10 is connected to a test system 70 during surge testing of the stator 10 as described below. The stator 10 may be sized and configured for use in, for example, a high-voltage (e.g., approximately 300 VDV) electric traction motor of a hybrid electric vehicle, an electric vehicle, or other system requiring motor torque for population or other purposes. The stator 10 has at least two layers of windings 12, but may include as many additional layers as are required for the particular application in which the stator 10 is to be employed.

The test system 70 includes a test device 50 and a pin set 15. The test device 50 is configured to execute a set of process instructions embodying a surge testing method 100. In executing such instructions, the test device 50 ultimately discharges a calibrated voltage (arrows 21) as a surge into the windings 12 of the stator 10 via the pin set 15, doing so at the approximate mid-point of the various layers of the stator 10.

It is recognized herein that a bar-wound design such as that of the stator 10 shown in FIG. 1 and similar designs may be isolated or broken out into individual electrical circuits. As a result, the windings 12 of the stator 10 may be directly and more fully stressed during surge testing via cooperative use of a conventional surge tester 60 and the present test system 70.

The example test system 70 of FIG. 1 may include an optional test probe 17. The test probe 17 is configured for measuring a voltage (arrow 23), hereinafter referred to as the measured voltage. The measured voltage (arrow 23) may be received from the test probe 17 and recorded in memory 55 of the test device 50. The measured voltage (arrow 23) may be used to calculate a voltage drop relative to the calibrated voltage (arrows 21) at various locations of the stator 10, e.g., between phases or between windings 12. In other embodiments, the test probe 17 may be part of a separate voltmeter that is placed in communication with the test device 50, such that the measured voltage is ultimately transmitted to and received by associated hardware and software portions of the test device 50 as described below.

The stator 10 of FIG. 1 includes an annular laminated stack 16 having a first side 11 and a second side 13. The laminated stack 16 may be formed by stacking laminations in a specific pattern, as is understood in the art. The lamination stack 16 defines a plurality of generally rectangular stator slots 18. The stator slots 18 are equally spaced and extend end-to-end between the first side 11 and the second side 13 within the laminated stack 16.

In the stator 10 shown in FIG. 1, each winding 12 is formed from a plurality of conductive bars or hair pins 24. The windings 12 may also include terminals or connections forming phase leads 20, 120, and 220. The hair pins 24 may be formed from a relatively heavy gauge, high conductivity wire such as copper, and with a generally rectangular cross section. Each hair pin 24 may have a curved section 22, and may terminate in wire ends 28. The hair pins 24 are accurately formed into a predetermined shape for insertion into the stator slots 18 in a weave pattern.

The hair pins 24 of FIG. 1 may be coated with a suitable insulating material 26 prior to insertion into the stator slots 18, such that the adjacent surfaces of the hair pins 24 within the stator slots 18 are electrically insulated with respect to each other. To facilitate joining of the wire ends 28, the wire ends 28 may be typically stripped of the insulating material 26 prior to insertion into the stator slots 18. Each stator slot 18 may be lined with a slot liner 30 to help insulate the hair pins 24 from the laminated stack 16 and from each other, and to prevent damage to the insulating material 26 during insertion of the hair pins 24 into the various stator slots 18.

FIG. 1 shows the curved ends 22 of the various hair pins 24 protruding from the first side 11 of the lamination stack 16. The wire ends 28 of the hair pins 24 likewise protrude from the second side 13 of the same stack 16. The wire ends 28 may be bent after insertion so as to form a complex weave from wire to wire so that each respective wire end 28 may be paired with and joined to a different wire end 28. The bent wire ends 28 are collectively referred to herein as the wire end portion 14 of the stator 10.

Adjacent paired wire ends 28 may be joined to form an electrical connection, for instance by soldering one wire end to its paired wire end to form a soldered joint. Each of the paired wire ends 28 may be individually welded or soldered to thereby form the required electrical connections between the layers. The resultant weave pattern and welded joints determines the path of the current flow through the windings 12.

Still referring to FIG. 1, the present test system 70 is configured for surge testing of the stator 10, either alone or in conjunction with the surge tester 60. The surge tester 60 can be used to inject a main voltage (arrow 121) as a surge or voltage spike into the stator 10. This causes a nonlinear voltage drop to occur as the electrical surge propagates through the windings 12. Turn-to-turn and phase-to-phase voltage stresses can drop significantly as the surge propagates, potentially causing some insulation flaws and/or other defects to go unnoticed. The present test system 10 is therefore intended to increase the error detection rate of a given stator 10 during surge testing by fully stressing the insulating material 26 of the windings 12, particularly at the turns.

The test system 70 may be configured as a bed of nails or another system providing similar levels of automatic engagement with non-insulated welds in the windings 12. As is well understood in the art, a bed of nails is an electronic test fixture having an array of spring-loaded pogo pins. Thus, a plurality of wires 34 and conductive leads 36 of the pin set 15 may be optionally configured as spring-loaded pogo pins, as indicated generally by double-headed arrow 25 in FIG. 1, with the wires 34 being alternatively straight, rigid lengths of wire as indicated by wire 134 in phantom. Wires 134 would then be aligned with the stator 10 such that each of the conductive leads 36 of the various pogo pins makes contact with a different test point on the stator 10. A bed of nails design may facilitate reliable and repeatable contact with numerous test points within the circuitry of the stator 10. Due to the manufacturing steps needed for hair pin-type hybrid traction motors, this test may only occur before insulation material is applied to the welded ends.

Alternatively, the wires 34 may be independently positioned with respect to the stator 10 such that the calibrated voltage (arrows 21) from the test system 70 may be injected or applied to any of the welded joints of the wire ends 28. Regardless of the embodiment, the conductive leads 36 each have a first end 31 which contacts the windings 12 during surge testing, and a second end 33 which is electrically connected to one of the wires 34.

The test device 50 may be embodied as a power control unit or module configured for executing process instructions embodying the present method 100. An example embodiment of the present method 100 is described below with reference to FIG. 2. The test device 50 may include one or more processors 56 in addition to the memory 55 noted above. Memory 55 may be embodied as non-volatile or volatile media, and may include any non-transitory/tangible medium which participates in providing data or computer-readable instructions as needed. Such instructions can be executed by the processor(s) 56.

The test device 50 of FIG. 1 may include any other required hardware and software components needed for executing the present method 100. For instance, the host machine may include a high-speed clock, analog-to-digital (A/D) circuitry, digital-to-analog (D/A) circuitry, and any required input/output (I/O) circuitry, I/O devices, and communication interfaces, as well as signal conditioning and buffer electronics.

The test device 50 may also include power conditioning components 57, some of which may be similar to those used in the surge tester 60. For instance, the power conditioning components 57 may include one or more capacitors 58 and a transformer/boost converter which produces a threshold voltage from a power supply/input line voltage (arrow 40), e.g., grid power of 110 VAC, 220 VAC, or a separate power source such as a 300 VDC test battery. The output of the transformer/boost converter then charges the capacitor 58 to the threshold voltage, e.g., approximately 100 VDC or more depending on the embodiment. Other power conditioning components 57 may include power switches or relays which can be tripped by the test device 50 to discharge the capacitor, and thus apply the calibrated voltage (arrows 21) to the stator 10.

During surge testing, the calibrated voltage (arrows 21) may be injected as a surge/spike directly to any of the targeted wire ends 28 at the approximate midpoint of the stator 10, or near the beginning and/or end of each layer of the stator 10. Conventional surge testing may take place at the first side 11 of the stack 16, for example by connecting tester 60 to one phase lead 220 while grounding the other two phase leads 20, 120 and injecting the main voltage (arrow 121) as a surge/spike into the phase lead 220. After surge testing via the phase lead 220, the phase lead 220 is grounded and the phase lead 20 is connected to the primary surge tester 60, and so on until all phase leads have received a surge in turn.

It is further recognized herein that conventional surge testing can cause some coils or portions of the windings to be insufficiently stressed, particularly at the approximate mid-layer point with respect to the phase leads 20, 120, 220. A voltage drop occurs at each successive layer. As a result, conventional surge testing solely via the phase leads 20, 120, and 220 may insufficiently stress the insulating material 26, particularly at the last half of each winding at the turns where insulating material 26 may be at its weakest. Therefore, exclusive use of conventional surge testers such as the surge tester 60 of FIG. 1 may insufficiently stress the turns of the windings 12.

Figure 2:
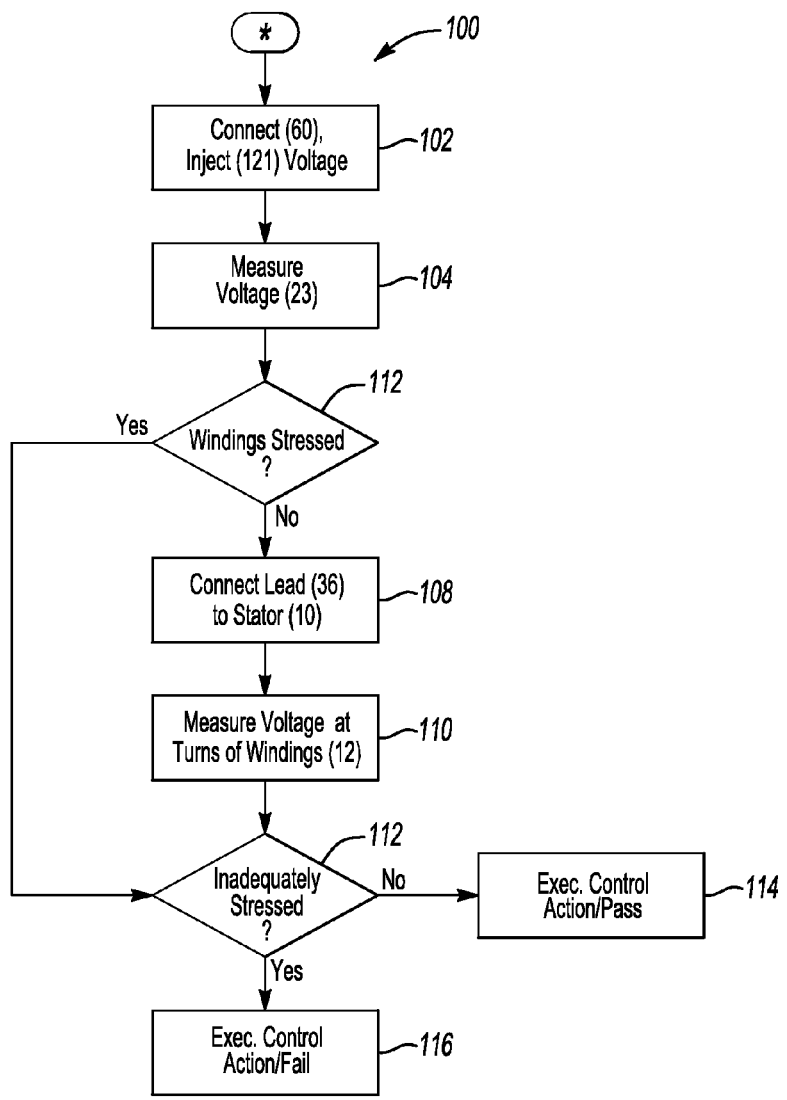
FIG. 2 a flow chart describing an example method for surge testing of the bar-wound stator shown in FIG. 1.

Referring to FIG. 2 in conjunction with FIG. 1, an example method 100 can begin with optional step 102. Step 102 is optional in the sense that the present method 100 may be limited in some embodiments to steps 108-116. Step 102 includes electrically connecting the surge tester 60 to one of the phase leads 20, 120, 220 of the stator 10 shown in FIG. 1, and then injecting the main voltage (arrow 121) as a surge/spike into the connected phase lead 20, 120, or 220. In a non-limiting embodiment, the main voltage (arrow 121) may be at least approximately 500 VAC. In another embodiment, the main voltage (arrow 121) may be at least approximately (1000 VAC) ($2V_L$), where $V_L$ represents the line voltage (arrow 40), or greater than 100 VDC when measured at the fully-charged capacitor 58 before discharge. Various options exist for the surge tester 60, including commercially available combination surge, resistance, and hi-pot test devices having variable input voltages. The method 100 then proceeds to optional step 104.

Step 104 includes measuring the voltage at turns of the windings 12 within the stator 10, recoding the measured voltage (arrow 23) via the test probe 17 or by other means, and then calculating the voltage drop using the processor(s) 56 of the test device 50. As understood in the art, the voltage drop may be calculated by subtracting the measured voltage (arrow 23) from the main surge voltage (arrow 121) or differential voltage between any two hair pins. The calculated voltage drop may be recorded in memory 55 of the test device 50. The method 100 then proceeds to step 106.

At optional step 106, the test device 50 of FIG. 1 may determine whether the turns of the windings 12 have been adequately stressed by the main voltage (arrow 121). Adequacy may be determined as a calibration value and recorded in memory 55. For instance, if at least a threshold percentage of the main voltage (arrow 121) injected as a surge is still present at the turns, the test device 50 may determine, for that particular test location, that surge from the main voltage (arrow 121) adequately stressed the turns of the windings 12. The method 100 proceeds to step 112 if such stressing is adequate. Otherwise, the method 100 may proceed to step 108.

Step 108, which is not optional, includes electrically connecting at least one conductive lead 36 of the test system 70 shown in FIG. 1 to each of the layers of the stator 10. Such connection may occur at the welded joints proximate to the wire ends 28, i.e., approximately mid-way through the winding 12 of the corresponding layer with respect to a phase lead 20, 120, 220 of the stator 10. Step 108 includes injecting the calibrated voltage (arrows 21) into the targeted winding(s) 12 of the stator 10 via the conductive leads 36. Step 108 may entail rapidly discharging one or more capacitors 58 of the power conditioning components 57 of FIG. 1 as a voltage surge into the windings 12. Such a surge may be, in one non-limiting embodiment, at least 100 volts AC or DC (100 VAC/VDC). The method 100 proceeds to step 110 once the surge has been injected.

At step 110, the test device 50 measures the voltage, e.g., using the test probe 17, at a desired location such as at the turns of the windings 12, and then uses the measured voltage (arrow 23) to calculate the voltage drop between the layers as explained above with reference to step 104. The method 100 then proceeds to step 112.

At step 112, the test device 50 determines whether the insulating material 26 at the turns of the windings 12 has been adequately stressed by the calibrated voltage (arrows 21) that is injected into the windings 12 at step 108. As with step 106, the adequacy of any stressing may be determined as a calibration value and recorded in memory 55. For instance, if at least a threshold percentage of the auxiliary surge voltage (arrow 21) is present at the turns, the test device 50 may determine, for that particular test location, that the calibrated voltage (arrows 21) adequately stressed the turns. The method 100 proceeds to step 114 if the stressing is determined to be adequate. Otherwise, the method 100 proceeds to step 116.

At step 114, having determined at step 112 that stressing via the test system 70 is adequate, the test device 50 of FIG. 1 may then execute a suitable control action with respect to the stator 10 under test. For instance, step 114 may include any or all of recording a passing diagnostic code in memory 55, activating an audio/visual indicator signaling a passing test for that particular phase, etc. The method 100 is thereafter complete for the tested phase. If other phases have not yet been tested, the method 100 may be repeated for the next untested phase. Once all phases have been successfully tested, the windings may be insulated at welded ends of the welded hair pins. The stator 10 may then be installed, e.g., into an electric traction motor, after insulating the windings.

At step 116, having determined at step 112 that stressing via the test system 70 of FIG. 1 is inadequate, the test device 50 executes a different control action than that executed in step 114. For instance, step 116 may entail recording a failing diagnostic code in memory 55, retesting the same phase starting with either of steps 102 or 108, signaling for further inspection and scrapping or repair of the stator 10, etc.

The detailed description and the drawings or figures are supportive and descriptive of the invention, but the scope of the invention is defined solely by the claims. While some of the best modes and other embodiments for carrying out the claimed invention have been described in detail, various alternative designs and embodiments exist for practicing the invention defined in the appended claims.

The invention claimed is:

1. A method for surge testing a bar-wound stator having a plurality of welded conductive hair pins arranged in a plurality of layers, the method comprising:
   electrically connecting a conductive lead of a test system to a corresponding one of the welded hair pins, prior to insulation of the welded hair pins, in each of the layers such that each conductive lead is electrically connected to the stator approximately mid-way through windings of the corresponding layer;
   applying a calibrated voltage via the conductive leads as a voltage surge into the windings of the stator at the welded hair pins by discharging a capacitor;
   measuring a voltage drop between turns of the windings after applying the calibrated voltage;
   recording the measured voltage drop in memory of the test system; and
   executing a control event with respect to the stator when the measured voltage drop is more than a calibrated threshold voltage drop.

2. The method of claim 1, further comprising: insulating the windings at welded ends of the welded hair pins after recording the measured voltage drop.

3. The method of claim 2, further comprising: installing the stator into an electric traction motor after insulating the windings.

4. The method of claim 1, wherein electrically connecting the conductive pin includes pressing a contact surface of a spring-loaded pogo pin against a mating contact surface of the welded hair pins.

5. The method of claim 4, wherein the mating contact surface is a welded joint which fuses two different layers of the stator.

6. The method of claim 1, further comprising:
   applying a main voltage as another voltage surge at a phase lead of the stator.

7. The method of claim 1, wherein applying a calibrated voltage includes discharging the capacitor into at least one of the beginning, the middle, and the end of each layer.

8. The method of claim 1, wherein applying a calibrated voltage surge via a capacitor includes applying a voltage of at least 100 VAC/VDC.

9. A system for surge testing a bar-wound stator having a plurality of welded hair pins arranged into a plurality of layers, the system comprising:
   a test device including a capacitor which selectively stores a calibrated voltage; and
   a pin set that is electrically connected to the test device, including:
      a plurality of conductive wires; and
      a plurality of conductive leads each connected to a corresponding one of the wires at one end and to the test device at another end, wherein the conductive leads are configured for selective connection to a welded end of a hair pin of each of the layers;
   wherein the test device is configured to:
      selectively discharge the capacitor to thereby apply the calibrated voltage, via the pin set, as a voltage surge into the windings of the stator;
      calculate a voltage drop between the layers of the stator at turns of the windings after discharging the capacitor;
      record the measured voltage drop in memory; and
      execute a control event with respect to the stator in response to the measured voltage drop.

10. The system of claim 9, wherein the plurality of conductive leads are arranged in a bed of nails configuration, and wherein each of the conductive leads is a spring-loaded pogo pin.

11. The system of claim 9, wherein the test system includes a test probe that is electrically connected to the test device, and wherein the test probe is configured to measure a voltage and relay the measured voltage to the test device.

12. A method for surge testing a bar-wound stator having a plurality of welded conductive hair pins arranged in a plurality of layers, the method comprising:
   applying a main voltage to a phase lead of the stator as a voltage surge;
   electrically connecting a conductive lead of a test system to a corresponding one of the welded hair pins, prior to insulation of the welded hair pins, in each of the layers such that each conductive lead is electrically connected to the stator approximately mid-way through windings of the corresponding layer, including pressing a contact surface of a spring-loaded pogo pin against a mating contact surface of the welded hair pins;
   applying a calibrated voltage surge of at least 100 VDC or 100 VAC via the conductive leads into the windings of the stator at the welded hair pins by discharging a capacitor of the test system into at least one of the beginning, the middle, and the end of each layer;
   measuring a voltage drop between turns of the windings after applying the calibrated voltage surge;
   recording the measured voltage drop in memory of the test system; and
   executing a control event with respect to the stator when the measured voltage drop is more than a calibrated threshold voltage drop.

13. The method of claim 12, further comprising: insulating the windings of the stator after recording the measured voltage drop.

14. The method of claim 13, further comprising: installing the stator into an electric traction motor after insulating the windings.

* * * * *